United States Patent

Kryzaniwsky

Patent Number: 5,099,309
Date of Patent: Mar. 24, 1992

[54] THREE-DIMENSIONAL MEMORY CARD STRUCTURE WITH INTERNAL DIRECT CHIP ATTACHMENT

[75] Inventor: Bohdan R. Kryzaniwsky, Hopewell Junction, N.Y.

[73] Assignee: International Business Machines Corporation, Armonk, N.Y.

[21] Appl. No.: 516,504

[22] Filed: Apr. 30, 1990

[51] Int. Cl.$^5$ .................... H01L 23/34; H01L 23/14; H01L 23/48

[52] U.S. Cl. ........................ 357/75; 357/80; 357/81

[58] Field of Search ............ 357/80, 75, 81, 82, 357/74; 361/394, 420, 385

[56] References Cited

U.S. PATENT DOCUMENTS

| | | | |
|---|---|---|---|
| 4,688,648 | 8/1987 | Sorel | 361/394 |
| 4,763,188 | 8/1988 | Johnson | 357/75 |
| 4,862,249 | 8/1989 | Carlson | 357/75 |
| 4,894,706 | 1/1990 | Sato et al. | 357/75 |
| 4,956,694 | 9/1990 | Eide | 357/74 |

FOREIGN PATENT DOCUMENTS 0073486 3/1983 European Pat. Off. .
2077534 12/1981 United Kingdom .

OTHER PUBLICATIONS

IBM Technical Disclosure Bulletin, vol. 18, No. 10, Mar. 1976, K. C. Joshi et al., "High Density Bubble Memory Package" pp. 3184–3185.

*Primary Examiner*—Rolf Hille
*Assistant Examiner*—Sheila V. Clark

[57] ABSTRACT

A memory card structure is disclosed containing an embedded three dimensional array of semiconductor memory chips. The card structure includes at least one memory core and at least one power core which are joined together in an overlapping relationship. Each memory core comprises a copper-invar-copper thermal conductor plane having a two dimensional array of chip well locations on each side of the plane. Polytetrafluoroethylene covers the major surfaces of the thermal conductor plane except at the bottoms of the chip wells. Memory chips are placed in the chip wells and are covered by insulating and wiring levels. Each power core comprises at least one copper-invar-copper electrical conductor plane and polytetrafluoroethylene covering the major surfaces of the electrical conductor plane.

Provision is made for providing electrical connection pathways and cooling pathways along vertical as well as horizontal planes internal to the card structure.

12 Claims, 8 Drawing Sheets

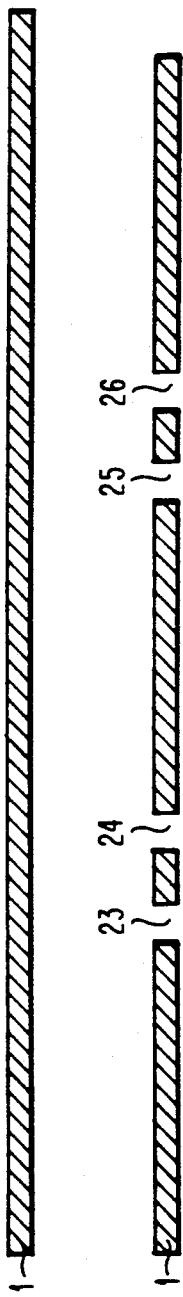
FIG. 1A
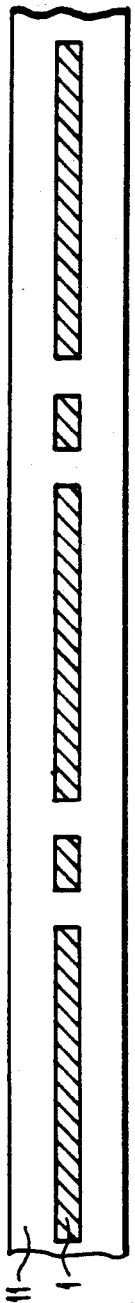
FIG. 1B
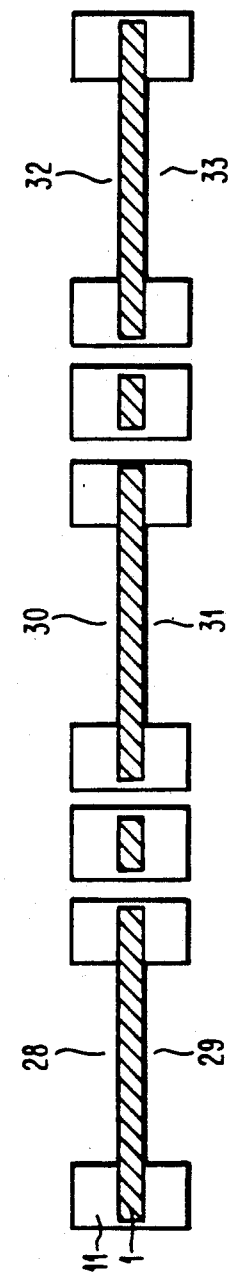
FIG. 1C
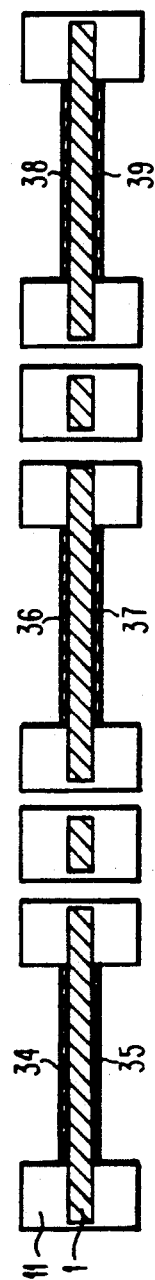
FIG. 1D
FIG. 1E
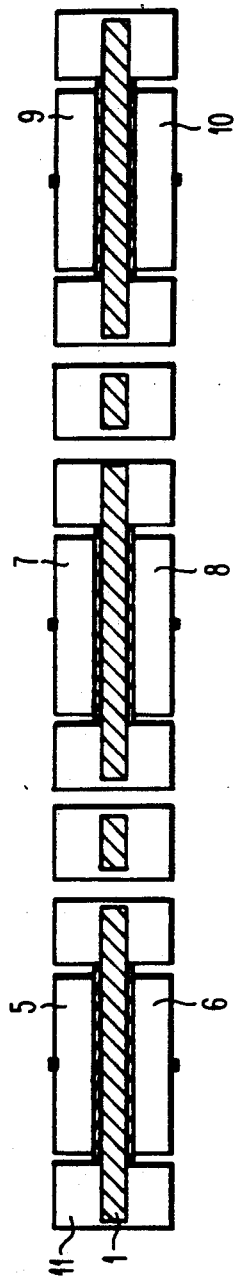
FIG. 1F

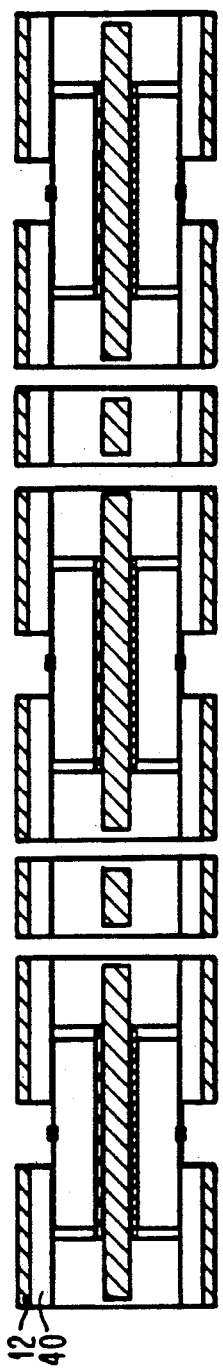

THREE-DIMENSIONAL MEMORY CARD STRUCTURE WITH INTERNAL DIRECT CHIP ATTACHMENT

BACKGROUND OF THE INVENTION

1. Field of the Invention

The present invention generally relates to high density, high speed transistor memory chip packaging and more particularly, to a card structure containing within itself a three dimensional configuration of memory chips.

2. Description of the Related Art

High speed signal transmission between computer system components is becoming increasingly important as machine cycle times are pushed toward ever shorter values. Excessive lead lengths between circuit units introduces high lead inductance which impacts data transmission speed. In the case of conventional semiconductor memory packaging, for example, memory chips are placed in memory modules which, in turn, are mounted on memory cards. Such three-level packaging introduces signal path length delays which are likely to become unacceptable in upcoming high speed machines. To take full advantage of the high speed signals generated at the chip level, the chip input-output (I/O) pad to card structure signal line distance must be made as short as possible.

In U.S. Pat. No. 4,849,284, issued on July 18, 1989 to David J. Arthur et al. for Electric Substrate Material, a ceramic filled fluoropolymer-based electrical substrate material is proposed for forming printed wiring boards for surface-mounted integrated circuit chips. The substrate material is said to enable board characteristics including low signal propagation delay. Increased chip density at the board level is not addressed, however.

U.S. Pat. No. 4,635,356, issued on Jan. 13, 1987 To Masayuki Ohuchi et al. for Method of Manufacturing A Circuit Module discloses a method for potting discrete resistors, capacitors and transistor devices into a multilayered module configuration. The supporting module structure for the potted devices is the cured potting resin itself. Although the described technique provides some measure of increased discrete device density, the materials used and the resulting structure are not aimed at solving the aforementioned problem of high density, high speed transistor memory chip packaging and its impact on high speed machine cycle time.

SUMMARY OF THE INVENTION

One object of the present invention is to provide a high density, high speed memory package characterized by minimal signal delay from memory chip to memory card structure.

Another object is to provide a memory card structure containing internally a three dimensional configuration of memory chips.

A further object is to provide a memory card structure having an internal three dimensional array of memory chips and characterized by maximum density, compatible thermal coefficients of expansion and ample heat dissipation.

In accordance with the present invention, dynamic random access memory (DRAM) chips or static RAM (SRAM) chips are placed directly within a multi-level memory card structure structure to eliminate the use of any intervening modules. The chips are positioned inside the card structure prior to the lamination of the signal and power layers to the card structure structure. To maintain thermal expansion stability between the chips and laminated card structure materials, a preferred embodiment of the present invention employs a glass-filled fluoropolymer-based material, commonly termed polytetra-fluoroethylene or PTFE. PTFE advantageously possesses a compliant nature, a thermal coefficient of expansion (TCE) approximately one half that of prior art epoxy glass dielectrics, a characteristic impedance about one third that of epoxy glass and a low dielectric constant, causing only a low signal propagation delay. The direct attachment of the memory chips within the card structure structure provides high operational speed and substantially increased chip density at the card structure level. Provision also is made for signal and power distribution between chips along vertical as well as horizontal planes internal to the card structure and for the cooling of the card structure. Memory control logic chips may be placed on the surface of the card structure.

DESCRIPTION OF THE PREFERRED EMBODIMENTS

Figure 1K:
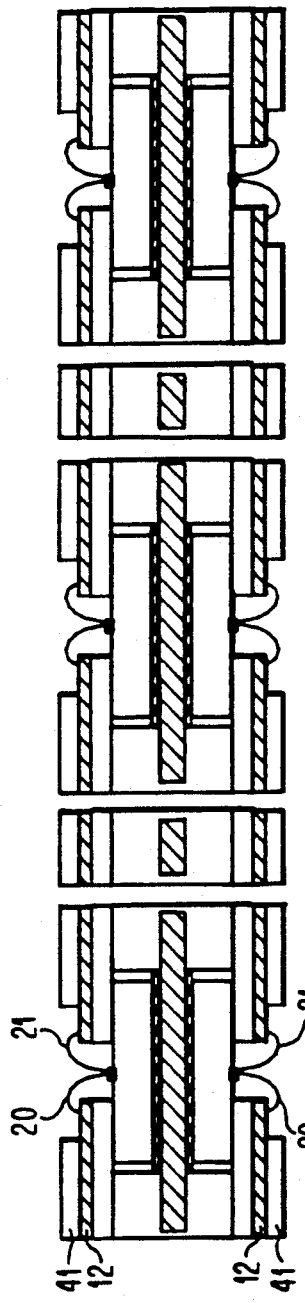
FIG. 1A to 1N are a series of simplified cross-sectional views of the chip core portion of a memory card structure constructed in accordance with the present invention as it would appear at successive times during fabrication.
Figure 1L:
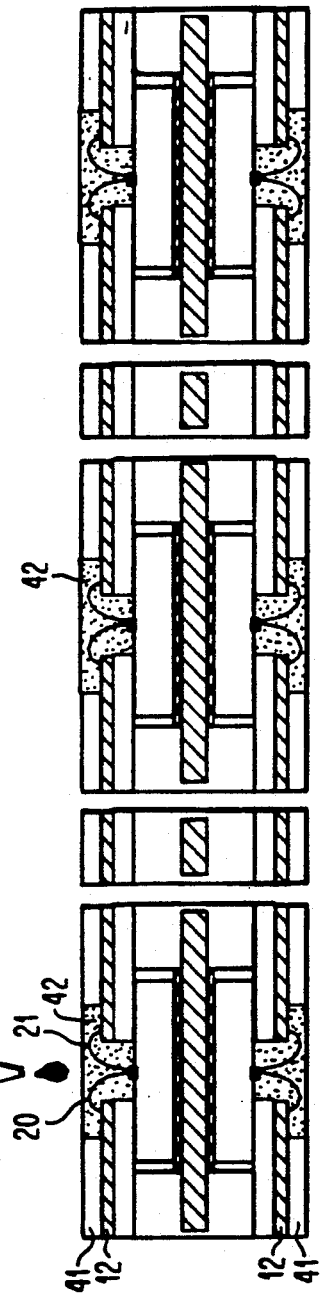
Figure 1M:
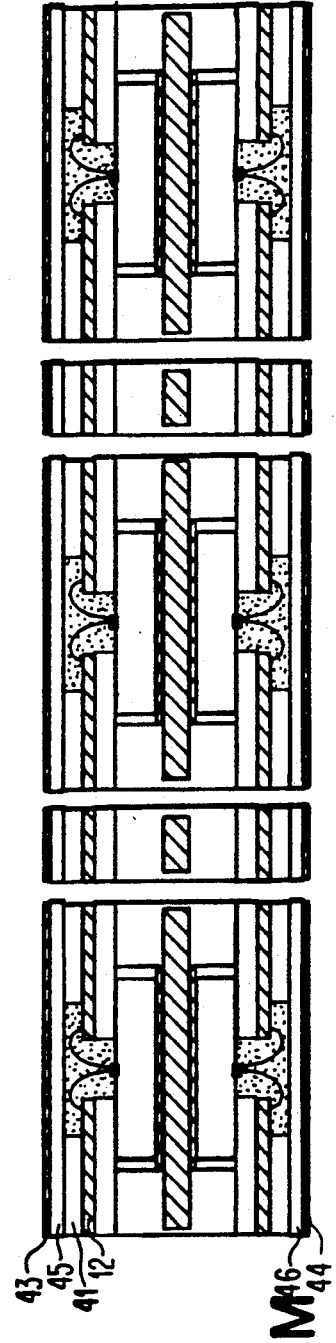
Figure 1N:
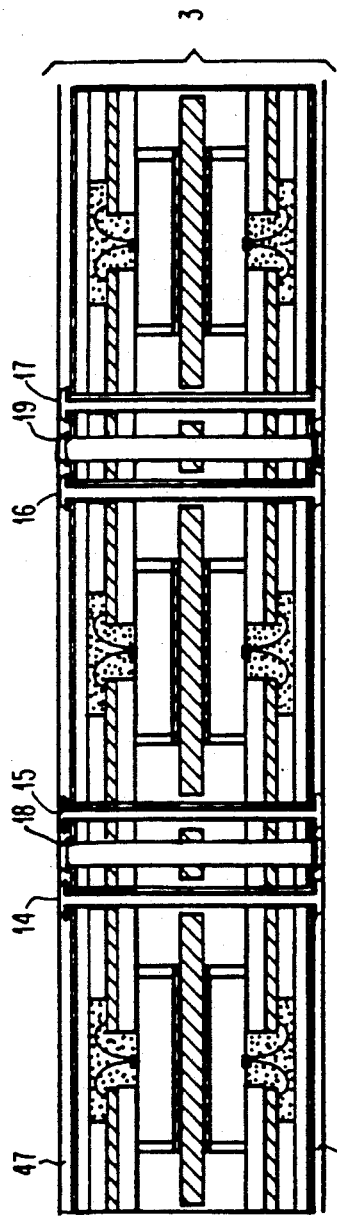
Figure 2:
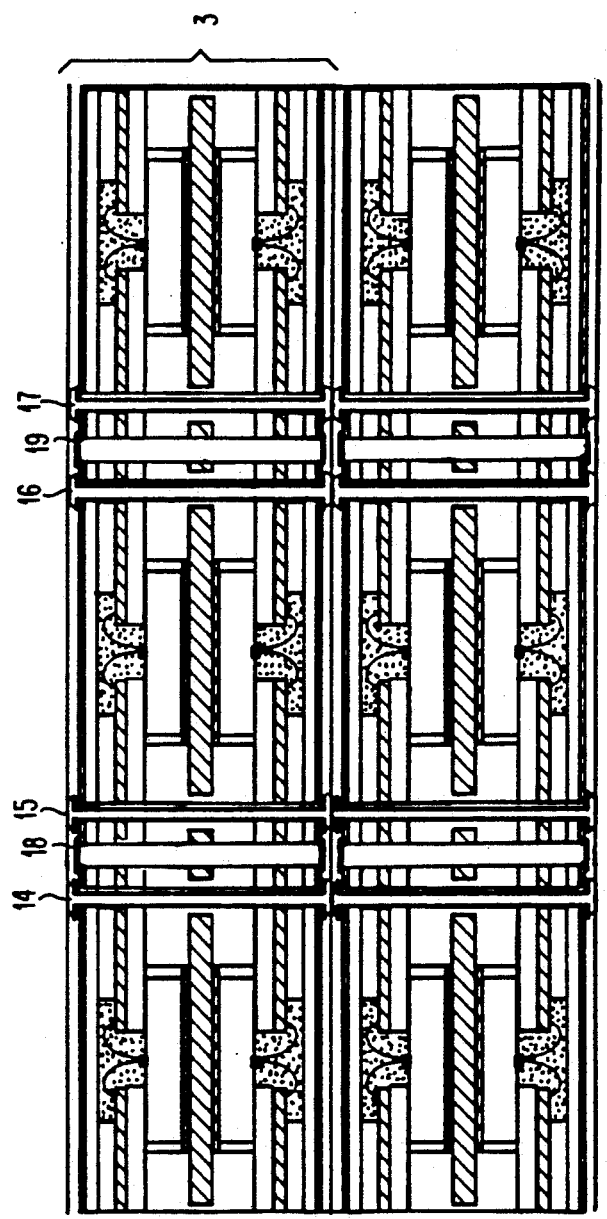
FIG. 2 is a cross-sectional view of two completed chip core portions joined together.
Figure 3:
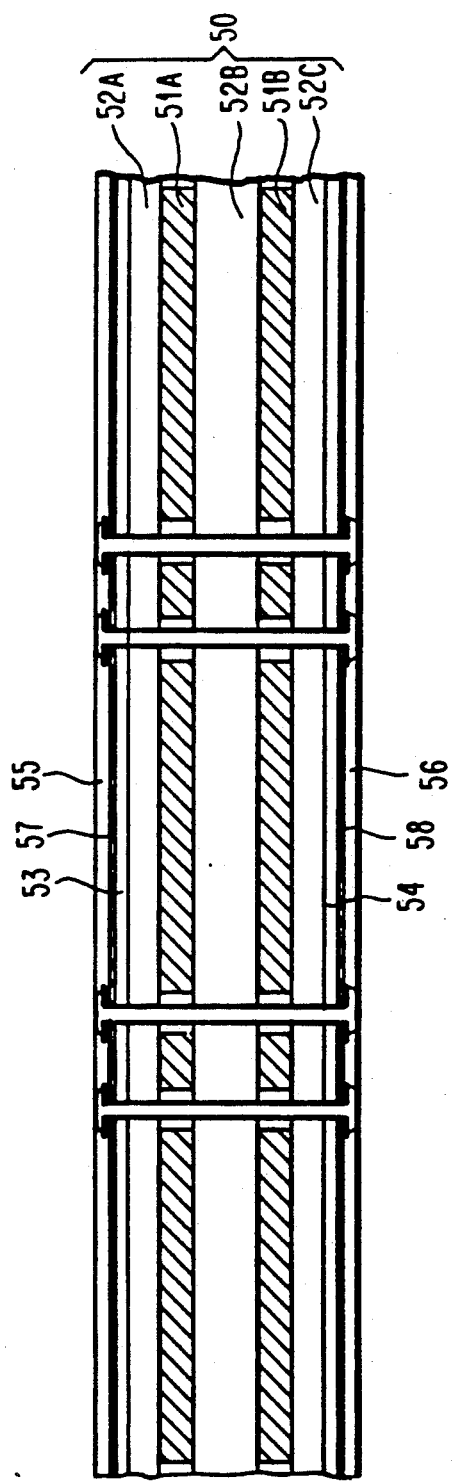
FIG. 3 is a cross-sectional view of the power core portion of the memory card structure of the present invention.
Figure 4:
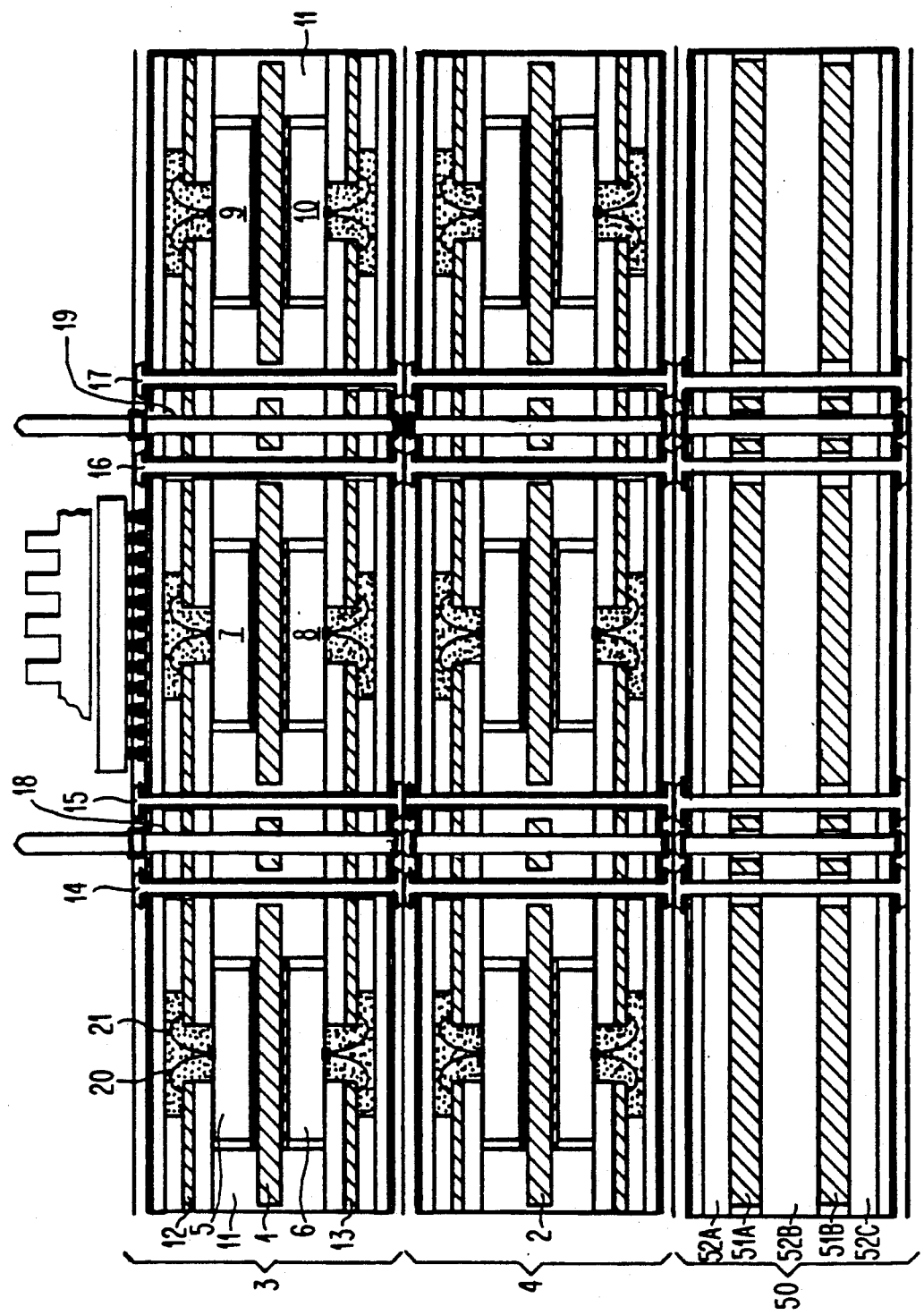
FIG. 4 is a cross-sectional view of one total memory card structure embodiment of the present invention including the chip core portions and power core portions of FIGS. 2 and 3, respectively.
Figure 5:
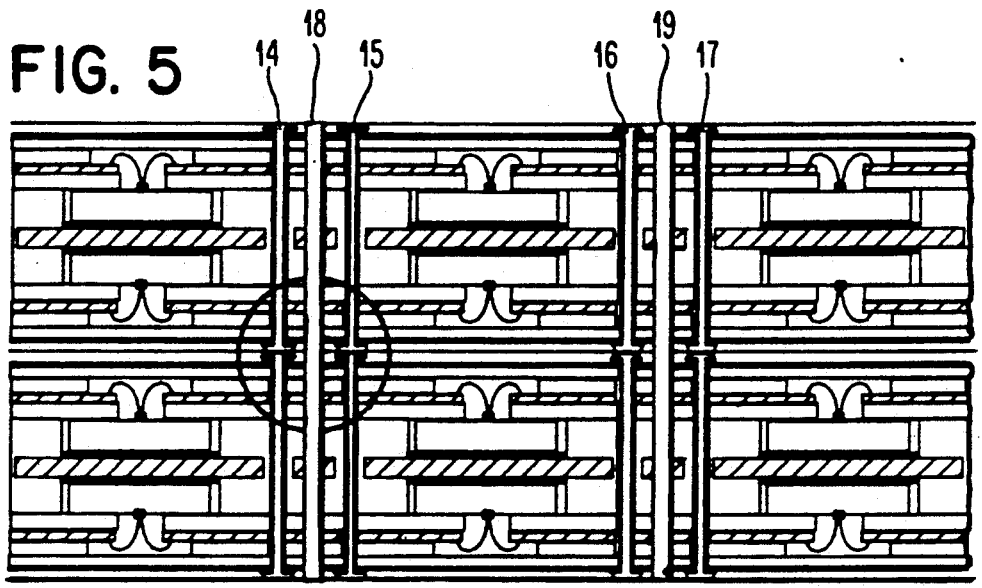
FIG. 5 is a partially exploded cross-sectional view of an alternative scheme for joining the chip core portions of FIG. 2.

Referring briefly to FIG. 4, a completed memory card structure, constructed in accordance with the present invention, will first be outlined before considering the detailed steps associated with FIGS. 1-3 by which the completed card structure is fabricated. Said card structure basically includes thermal conductor planes 2 in respective chip cores 3 and 4, memory chips (such as chips 5-10, inclusive, of core 3) in each of chip cores 3 and 4, dielectric layers (such as layers 11 of core 3) in each of chip cores 3 and 4, lead frames (such as lead frames 12 and 13 of core 3) in each of chip cores 3 and 4, together with plated-through-vias (such as vias 14, 15, 16 and 17 of core 3) and cooling vias 18 and 19.

Electrical contact is established with the embedded chips using appropriate plated vias and connected lead frame portions which are wire bonded (such as by wires 20 and 21 of core 3) to chip pads. The thermal conductor planes (such as plane 1 of core 3) make contact with cooling vias 18 and 19 to remove heat generated within the memory chips. Each of the dielectric layers 11 preferably comprises polytetrafluoroethylene (PTFE) material in order to exploit the attributes thereof including its compliant nature, low TCE, low characteristic impedance and low dielectric constant which translate into the desirable memory card structure characteristics of thermal expansion stability and reduced signal propagation delay.

The memory card structure of FIG. 4 further comprises power core portion 50 which employs the same material preferably a copper-invar-copper alloy) for power busses 51 as is used in the chip cores 3 and 4 for the thermal conductor planes 1 and 2. The power busses are insulated by the same PTFE material 52 as is used for the dielectric layers such as layer 11 of core 3. Thus, the same benefit of thermal expansion stability is realized for power core 50 as for chip cores 3 and 4 due to the use of the same materials. Vias 14-17 and cooling vias 18 and 19 also penetrate power core 50.

Referring now to FIG. 1A, the steps for fabricating chip cores 3 and 4 will be described. For the sake of clarity, the same reference numerals of FIG. 4 will be used for the corresponding items of FIG. 1. Each chip core contains a thermal conductor plane (preferably copper-inver-copper) such as plane 1. Plane 1 also serves as a major structural support member for the core and is apertured at locations 23-26 of FIG. 2B to provide for vias 14-17 of FIG. 4. Dielectric material 11, preferably PTFE because of its compliant nature and the other desirable properties discussed previously, is applied to both sides of the apertured conductor plane 1 as shown in FIG. 2C.

Chip wells 28-33 of FIG. 1D are formed by chemical or mechanical means in dielectric material 11 to provide sites for the placement of chips 5-10 of FIG. 4. Double-sided thermally conductive dielectric tape segments 34-37 of FIG. 1E are positioned in wells 28-33 to secure memory chips 5-10 as shown in FIG. 1F.

The punched copper lead frame 12 of FIG. 1G is mounted on drilled PTFE carrier sheet 40 and is laminated over the chip core structure of FIG. 1H. Frame 12 contains fan-out circuitry for accessing memory chip circuit nodes. A drilled dielectric sheet 41 of FIG. 1I serves as a dam for an encapsulating material. The dam 41 material is laminated to both sides of the structure of FIG. 1H as illustrated in FIG. 1J. Wire bonds such as 20 and 21 of FIG. 1K join chip noes to respective lead frame conductors and are encapsulated with an epoxy fill 42 of FIG. 1L on both sides of the chip core. When all of the wire bond wells are encapsulated front and back circuit wiring planes 43 and 44 of FIG. 1M are added over respective insulating layers 45 and 46 and are laminated to the structure.

The chip core is completed by circuit personalization metallization, i.e., holes (not shown) are formed in insulating layers 41 and 45 to permit the connection of lead frame 12 to the wiring plane 43 as desired (on both sides of the chip core); vias 14-17 are plated as shown in FIG. 1N to provide electrical continuity between the wiring planes of the chip core; holes are drilled and filled with, for example, solder, copper or other metal to form cooling vias 18 and 19 which contact the thermal conductor planes 1 and 2; and a protective coating 47 is applied to both surfaces of the chip core. In the embodiment of FIG. 4, it will be noted that solid cooling vias are provided but for higher power dissipation applications, the plated holes may be replaced by hollow holes adapted for water cooling. Appropriate heat exchanges (not shown) are connected to the ends of the cooling vias.

The chip core 3 is joined to one or more chip cores as in FIG. 2 by thermal-compression bonding, conductive polymers or other means using the pads at the ends of the plated vias 14-17 and at the ends of the cooling vias 18, 19. The power core of FIG. 3, comprising laminated electrically conductive layers 51A nd 51B, dielectric layers 52A-C and 53-56 and circuit wiring planes 57 and 58, also is joined as in FIG. 4 to the chip cores to complete the memory card structure. Preferably, layers 52A, 52B and 52C comprise PTFE and layers 51A and 51B comprise copper-invar-copper. Logic drivers and interfacing circuits to and from the system can be directly mounted on either or both major surfaces of the card structure.

Figure 6:
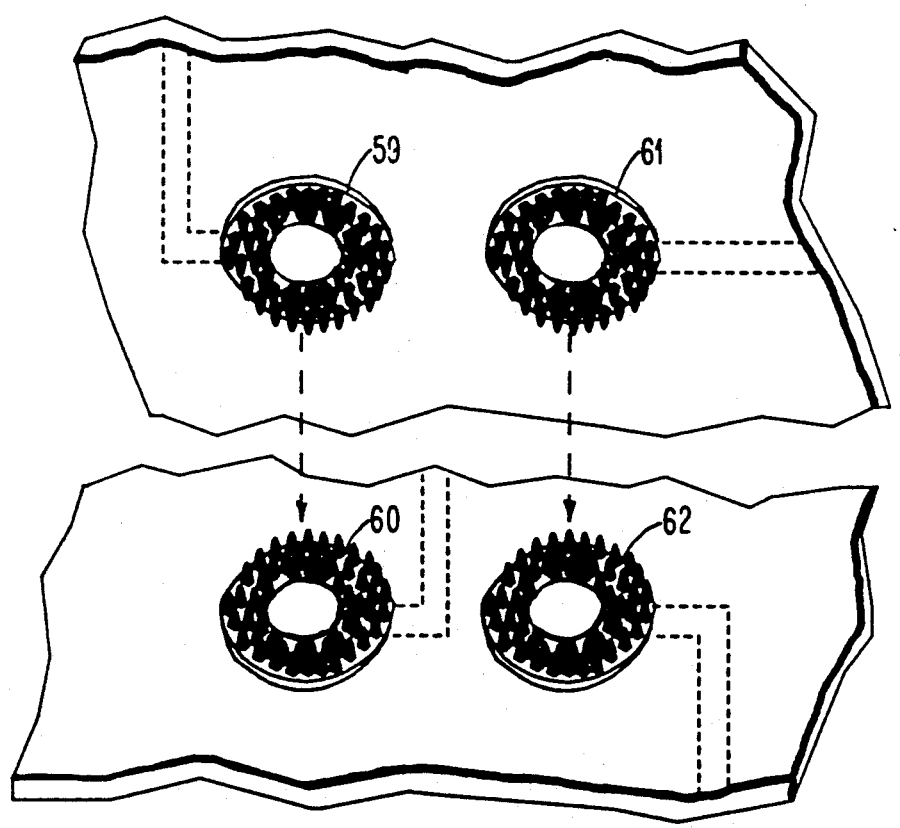
FIG. 6 is a perspective view of an alternative construction for the power planes of FIG. 1D.

Instead of permanently joining the cores to each other by thermal-compression bonding or the like in the described manner, the detachable joint of FIG. 6 may be substituted to permit rework or replacement of chip cores containing unacceptable numbers of defective chips. Mechanical pressure joints consisting of mating pads 59 and 60 and pads 61 and 62 are placed on respective facing ends of vias 14-17 and cooling vias 18 and 19. The pads mesh together under applied pressure to form a solid electrical or thermal contact.

Figure 7:
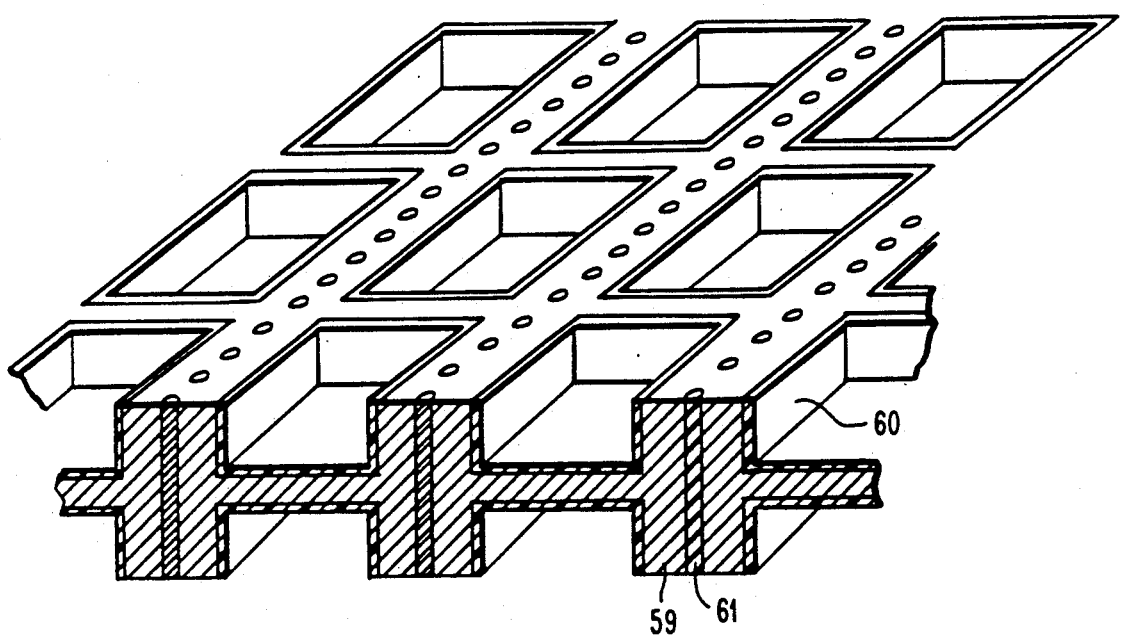

FIG. 7 shows a preformed molybdenum thermal conductor 59, lined with PTFE 60 along the interior vertical surfaces, that may be substituted for the structure of FIG. 1D in the fabrication process of FIGS. 1E-1N. The walls of conductor 59 surround and protect the memory chips (to be placed therein) from any inadvertent damage during the thermal compression bonding steps of the memory card structure fabrication process. Additionally, the use of molybdenum enhances the thermal conduction capacity of conductor 59 relative to that of the copper-invar-copper conductor 1 previously described. The holes 61 in conductor 59 require insulating linings so that they can be plated and used as signal or power vias.

It should be noted that additional chip cores may be mounted on either side of power core 20 of FIG. 4, depending upon thermal requirements and the allowable total card structure thickness in a given memory design situation.

What is claimed is:

1. A card structure having an internal three dimensional array of semiconductor chips, said card structure including:
   at least one first core;
   at least one power core;
   one of said first cores lying on and joined to said power core;
   each said first core comprising:
      a thermal conductor plane having a two dimensional array of chip well locations one each side of said plane, and
      a first complaint dielectric material on the major surfaces of said plane except at the bottoms of said wells, said first material having a low dielectric constant and having a thermal coefficient of expansion compatible with those of said chips and said thermal conductor plane, whereby thermal expansion stability with said chips and said thermal conductor plane is maintained; each said power core comprising:
   at least one electrical conductor plane, and
   a second compliant dielectric material on the major surfaces of said plane, said second material having a thermal coefficient of expansion compatible with said electrical conductor plane, whereby thermal expansion stability with said electrical conductor plane is maintained; and said semiconductor chips in respective ones of said wells.

2. The card structure defined in claim 1 wherein each said chip is a memory chip.

3. The card structure defined in claim 1 wherein said thermal conductor plane and said electrical conductor plane are made of the same conductor material.

4. The card structure defined in claim 3 wherein said same conductor material is copper-invar-copper.

5. The card structure defined in claim 1 wherein said first and said second dielectric materials are the same dielectric material.

6. The card structure defined in claim 5 wherein said same dielectric material is polytetrafluoroethylene.

7. The card structure defined in claim 1 and further including a plurality of cooling vias, each said via penetrating through said first core and said power core at locations between said wells, each said via containing material thermally contacting said thermal conductor plane.

8. The card structure defined in claim 1 and further including a plurality of aligned conductive vias, each said via penetrating through said first core and said power core at corresponding locations between at said wells, the facing ends of said vias at corresponding locations being joined together, and each said via being insulated from said conductor plane.

9. The card structure defined in claim 8 wherein said facing ends of said conductive vias are joined together by metallic dendrite pads, each pad being fixed to a respective facing end of said vias.

10. The card structure defined in claim 1 wherein said thermal conductor plane is shaped so as to surround the sides of each said chip.

11. The card structure defined in claim 10 wherein said thermal conductor plane comprises molybdenum.

12. The card structure defined in claim 1 wherein each said chip is a memory chip, said thermal conductor plane and said electrical conductor plane are comprised of copper-invar-copper, and said first and said second dielectric materials polytetrafluoroethylene.

* * * * *